United States Patent [19]

Cain

[11] Patent Number: 5,342,476

[45] Date of Patent: Aug. 30, 1994

[54] REDUCTION OF POLYCIDE RESIDUES THROUGH HELIUM BACKSIDE PRESSURE CONTROL DURING DRY ETCHING

[75] Inventor: John L. Cain, Schertz, Tex.

[73] Assignee: VLSI Technology, Inc., San Jose, Calif.

[21] Appl. No.: 7,348

[22] Filed: Jan. 21, 1993

[51] Int. Cl.⁵ .............................................. B44C 1/22
[52] U.S. Cl. .................................... 136/643; 136/646; 437/226; 437/248; 437/943; 148/DIG. 131
[58] Field of Search ............... 156/643, 646; 437/228, 437/248, 943; 148/DIG. 131; 118/719

[56] References Cited

U.S. PATENT DOCUMENTS

| | | | |
|---|---|---|---|
| 4,565,601 | 1/1986 | Kakehi et al. | 156/643 |
| 4,709,655 | 12/1987 | Van Mastrigt | 118/719 |
| 4,999,320 | 3/1991 | Douglas | 148/DIG. 131 |
| 5,096,536 | 5/1992 | Cathey, Jr. | 156/643 |
| 5,164,034 | 11/1992 | Arai et al. | 156/643 |
| 5,203,958 | 4/1993 | Arai et al. | 156/643 |

OTHER PUBLICATIONS

Wolf et al., "Silicon Processing for the VLSI Era", vol. 1, Lattice Press, Sunset Beach, Calif., 1986, pp. 388–393, 557–558.

*Primary Examiner*—Tom Thomas
*Assistant Examiner*—Kevin M. Picardat
*Attorney, Agent, or Firm*—Burns, Doane, Swecker & Mathis

[57] ABSTRACT

Disclosed are methods for reducing the degree of underetching and particulate contamination occurring during dry non-isotropic etching of a polycide layer on the surface of a silicon wafer maintained in a wafer holder wherein the backside of the holder is cooled with a stream of helium gas. Specifically, in the disclosed methods, dry non-isotropic etching of the polycide layer is conducted either in the absence of backside cooling or the helium gas flow utilized in backside cooling is maintained at a pressure of no more than 3 torr.

18 Claims, No Drawings

REDUCTION OF POLYCIDE RESIDUES THROUGH HELIUM BACKSIDE PRESSURE CONTROL DURING DRY ETCHING

BACKGROUND OF THE INVENTION

1. Field of the Invention

This invention is directed to methods for reducing the degree of underetching and particulate contamination occurring during dry non-isotropic etching of a polycide layer on the surface of a silicon wafer maintained in a wafer holder wherein the backside of the holder is cooled with a stream of helium gas. Specifically, in the methods of this invention, dry non-isotropic etching of the polycide layer is conducted either in the absence of backside cooling or the helium gas flow utilized in backside cooling is maintained at a pressure of no more than 3 torr.

2. State of the Art

The formation of non-isotropic patterns (i.e., essentially vertical etch profiles) on the surface of silicon wafers is essential when the thickness of the film being etched is comparable to the minimum pattern dimensions of the to-be-formed features. For example, in very large scale integration (VLSI) devices, many of the films have thickness on the order of about 0.5 to 1 microns ($\mu$m) whereas the to-be-formed patterns are on the order of about 1 to 2 $\mu$m. Accordingly, undercutting which accompanies typical isotropic etching methods (e.g., wet etching) becomes intolerable at these dimensions. See, for example, Wolf, "Silicon Processing for the VLSI Era", Vol. 1, Chapter 16 ("Dry Etching for VLSI Fabrication"), Lattice Press, Sunset Beach, Calif. (1986).

In view of the above, dry non-isotropic etching procedures have been developed to transfer such patterns onto silicon wafers including, by way of example, reactive ion etching, reactive ion beam etching, electron beam etching, plasma etching, and the like. Common to such dry non-isotropic etching procedures is the use of a reaction chamber wherein the silicon wafer to be etched is placed in a wafer holder. In addition to holding the wafer, the wafer holder is also used to maintain a constant wafer temperature which, among other factors, is important to ensure constant etch rates on the wafer. Typically, the wafer is maintained between 20° and 60° C. during dry non-isotropic etching and, if the wafer temperature is uneven over its surface, then areas of the wafer which are at higher temperatures will tend to etch faster then areas of the wafer maintained at lower temperatures. In turn, uneven etch rates can provide for undesirable uneven patterning which can reduce the degree of non-isotropic etching.

Suitable wafer holders include electrodes (which can impart a low level of heat to the wafer to maintain constant wafer surface temperatures), inert materials (which can act as a heat sink during non-isotropic etching to maintain constant wafer surface temperatures), and the like. In general, a stream of helium gas is permitted to flow to the backside of the wafer holder (the surface of the holder opposite the wafer) to further ensure constant wafer temperature which procedure is referred to as "backside cooling". Typically, in backside cooling, the flow of helium gas is set to maintain a pressure of about 10-14 tort on the backside of the wafer holder.

Notwithstanding the advantages of dry non-isotropic etching, serious problems with underetching and particulate formation are encountered when such etching is employed to remove polycides from the wafer surface. Specifically, refractory metal polycides (e.g., tungsten silicide ($WSi_2$), molybdenum silicide ($MoSi_2$), and the like) are employed at numerous sites of the to-be-formed circuits elements including, by way of example, metal interconnect technology, Si-gate technology, and the like, because such silicides have lower resistance, i.e., sheet resistance, as compared to polysilicon. In turn, lower sheet resistance permits the semiconductor device to be operated under faster real time conditions thereby enhancing the operating speed of the device.

In forming a layer of refractory metal polycide on the surface of such circuit elements, a layer of refractory metal or refractory metal silicide is first deposited over the entire surface of the wafer. When a refractory metal is deposited, the metal is then converted to a metal silicide by conventional methods such as thermal annealing. In either case, a layer of resist is then patterned over the surface of the wafer so as to define the to-be-formed circuit elements containing a surface of metal silicide. Next, the wafer surface is subjected to dry non-isotropic etching so as to remove the metal silicide in all areas except under the resist. Upon removal of the resist layer, a surface layer of metal silicide is found only at the desired circuit features.

It has been found, however, that the dry non-isotropic etching of the metal silicide layer on the surface of a silicon wafer utilizing backside cooling results in underetching of the wafer coupled with gross residues across the wafer surface. Both phenomena are severely deleterious to the effectiveness of the etch process as well as the wafer produced thereby. Specifically, underetching of the wafer surface and particulate contamination on the surface of the wafer can alter the functionality of the to-be-formed circuit elements.

SUMMARY OF THE INVENTION

This invention is directed to the unexpected discovery that reducing or eliminating the backside cooling of the wafer holder by helium gas during dry non-isotropic etching of the wafer significantly reduces the degree of underetching and particulate formation. Preferably, in the methods of this invention, the flow of helium gas to the backside of the wafer holder is reduced to a pressure of about 0–3 torr on the backside of the wafer holder as compared to a pressure of about 10–14 torr which is conventionally employed.

Accordingly, in one of its method aspects, this invention is directed to a method for reducing the degree of underetching and particulate formation occurring during dry non-isotropic etching of a polycide layer on the surface of a silicon wafer which comprises:

(a) placing a patterned resist layer over the polycide layer found on the surface of the silicon wafer so as to define areas where the polycide layer is exposed and areas where the polycide layer is covered by the resist layer;

(b) placing the silicon wafer prepared in step (a) into a wafer holder;

(c) removing the exposed polycide layer from the surface of the silicon wafer by dry non-isotropic etching optionally employing backside cooling with a helium gas flow to the backside of the wafer holder wherein the helium gas flow is adjusted to maintain a backside pressure of from 0 to about 3 torr; and (d) removing the resist layer.

In a preferred embodiment, the dry non-isotropic etching is selected from the group consisting of reactive ion etching, reactive ion beam etching, electron beam etching, and plasma etching. More preferably, the dry non-isotropic etching is reactive ion etching which is conducted in a reactive ion etching reaction chamber wherein the wafer holder is an electrode. Still more preferably, the polycide layer subjected to reactive ion etching is a tungsten silicide layer ($WSi_2$).

In another preferred embodiment, the helium gas flow used for the helium backside cooling is maintained at about 2 torr.

In one of its composition aspects, this invention is directed to silicon wafers prepared by the methods of this invention.

DETAILED DESCRIPTION OF THE INVENTION

This invention is directed to novel and unexpected discovery that minimizing or eliminating helium backside cooling during dry non-isotropic etching of a polycide layer significantly reduces underetching and particulate formation during such etching. However, prior to describing this invention in more detail, the following terms will first be defined:

The term "polycides" refers to refractory metal silicides including, by way of example, tungsten silicide ($WSi_2$), molybdenum silicide ($MoSi_2$), tantalum silicide ($TaSi_2$), titanium silicide ($TiSi_2$), platinum silicide (PtSi), and the like. Such silicides are well known in the art and are described, for example, by Wolf, "Silicon Processing for the VLSI Era", Vol. 1, pp. 384–405 (1986).

The preparation of films or layers of refractory metal silicides is generally accomplished by either the deposition of a layer of refractory metal followed by thermal annealing of the deposited layer to form the refractory metal silicide or by the deposition of a refractory metal silicide.

The term "dry non-isotropic etching" refers to etching procedures which do not employ liquids to effect etching (hence "dry"); which etch in a substantially non-isotropic manner; and which conventionally employ helium backside cooling. Suitable dry non-isotropic etching procedures are well known in the art and include, by way of example, reactive ion etching, reactive ion beam etching, electron beam etching, plasma etching, and the like. See, for example, Wolf, "Silicon Processing for the VLSI Era", Vol. 1, pp. 539–585, Lattice Press, Sunset Beach, Calif. (1986), which is incorporated herein by reference.

The term "patterned resist layer" refers to the patterned placement of a resist layer onto the surface of a polycide film or layer which is found on a silicon wafer.

The term "wafer holder" refers to any holder conventionally employed to hold the wafer during dry non-isotropic etching. In reactive ion etching, the wafer holder is preferably an electrode containing internal coils which permit water to run therethrough.

METHODOLOGY

Formation of the Polycide Layer

In the methods of this invention, a polycide layer is first formed onto a silicon wafer. As noted previously, the method for forming such a layer is conventional and includes sputter deposition and chemical vapor deposition of a layer or film of either a refractory metal or refractory metal silicide.

The conditions required to effect such deposition are well known in the art. For example, chemical vapor deposition [including low-pressure chemical vapor deposition (LPCVD), plasma enhanced chemical vapor deposition (PECVD), photon-induced chemical vapor deposition (PHCVD), and the like] is described by Wolf, "Silicon Processing for the VLSI Era", Vol. 1, pp. 161–197 (1986) which is incorporated herein by reference.

Suitable reaction conditions used for the deposition of refractory metals and metal silicides by CVD conditions are not critical and any suitable CVD conditions can be used. Generally, CVD conditions typically include pressures from a few millitorr to about 10 torr or slightly greater and preferably from about 75 mtorr (millitorr) to about 10 torr and even more preferably from about 100 millitorr to about 5 torr. CVD conditions also typically include reaction temperatures which are sufficient to effectively vaporize the refractory metal source materials and when desired, to allow the refractory metal so formed to concurrently deposit and adhere to the substrate. Such temperatures can generally range from about 300° C. to about 700° C. More preferably, the temperature for CVD deposition of refractory metal is from about 400° C. to about 700° C.

The specific conditions employed will vary with the particular chemical vapor deposition process used and the skilled artisan is readily capable of making the adjustments to the reaction conditions to effect deposition of the refractory metal or the refractory metal silicide.

For example, low pressure chemical vapor deposition (LPCVD) is achieved at medium vacuum (several hundred millitorr to about 10 torr), and higher temperatures (e.g., about 500° to 600° C.). LPCVD reactors successfully deposit refractory metals in a reaction rate limited regime. When the pressure is reduced sufficiently, the diffusivity of the reactant gas molecules is increased such that the mass-transfer to the substrate does not substantially limit the growth rate. Although the surface reaction rate is very sensitive to temperature, precise temperature control is relatively easy to achieve.

The use of LPCVD conditions for refractory metal deposition allows for several advantages. First, the elimination of mass-transfer constraints on reactor design allows the reactor to be optimized for high wafer capacity. Additionally, low pressure operation also decreases gas phase reactions, thus making LPCVD refractory metal films or layers less subject to particulate contamination.

Similarly, plasma enhanced chemical vapor deposition (PECVD) is a variation of chemical vapor deposition which is characterized not only by pressure, but also by its method of energy input. Rather than relying solely on thermal energy to initiate and sustain chemical reactions, the PECVD of refractory metals uses an rf-induced glow discharge to transfer energy into the reactant gases, allowing the substrate to remain at a lower temperature than in LPCVD processes.

Lower substrate temperature is one primary advantage of PECVD, and, in fact, PECVD provides a method of depositing refractory metal films or layers on substrates that do not have the thermal stability to accept coating by other methods. In addition, PECVD can enhance the deposition rate of refractory metal when compared to thermal reactions alone, and produce films or layers of unique compositions and properties. For example, a number of the desirable properties achieved by PECVD of refractory metal include good adhesion, low pinhole density, good step coverage, adequate electrical properties and compatibility with fine-line pattern transfer processes.

In a preferred embodiment, the PECVD of refractory metal films or layers controls and optimizes several deposition parameters in addition to those used in LPCVD processes, including, e.g., rf power density, frequency, and duty cycle. The deposition process is dependent in a very complex and interdependent way on these parameters, as well as on the usual parameters of gas composition, flow rates, temperature, and pressure. Furthermore, as with LPCVD, the PECVD method is surface reaction limited, and adequate substrate temperature control is thus desirable to ensure film thickness uniformity.

Photon-induced chemical vapor deposition (PHCVD) refers to the use of high-energy, high-intensity photons to either heat the substrate surface or to dissociate and excite reactant species in the gas phase. In the case of substrate surface heating, the reactant gases are transparent to the photons, and the potential for gas phase reactions is completely eliminated. In the case of reactant gas excitation, the energy of the photons can be chosen for efficient transfer of energy to either the reactant molecules themselves, or to a catalytic intermediary, such as mercury vapor.

The PHCVD of refractory metal has the advantage of allowing the deposition of refractory metal at extremely low substrate temperatures, i.e., room temperature. PHCVD-deposited metal also has the advantage of providing good step coverage. However, adequate precautions must be taken to avoid low density and molecular contamination as a result of the low deposition temperature.

When a layer of refractory metal is deposited onto the silicon wafer, the metal is then converted to refractory metal silicide by conventional methods such as thermal annealing. Thermal annealing is accomplished by art recognized methods and results in the adherence of the refractory metal silicide onto the surface of the silicon wafer. Any method for thermal annealing is acceptable under the present invention including rapid thermal annealing. When rapid thermal annealing is employed, the duration of the thermal anneal process ranges anywhere from about a few seconds to about 2 minutes and is generally accomplished at a temperature sufficient to form the silicide to no more than about 1000° C.

The thermal annealing step can be conducted in the same reaction chamber as the chemical vapor deposition (CVD) step by maintaining a sufficiently high reaction temperature (e.g., at least about 600°–650° C.) during deposition to ensure the rapid thermal annealing of the deposited refractory metal. Alternatively, the thermal annealing step can be conducted as a separate step in the CVD reaction chamber or in a reaction chamber separate and apart from the CVD reaction chamber.

In any event, the polycide formed on the surface of a silicon wafer is typically from about 0.05 to about 0.5 microns in thickness and preferably from about 0.1 to about 0.2 microns in thickness.

Placement of the Patterned Resist Layer

In the next step of the methods of this invention, a patterned resist layer is placed onto the surface of the polycide by conventional lithographic techniques which are well known in the art and some of which are described by Wolf, "Silicon Processing for the VLSI Era", Vol. 1, pp. 407–513, Lattice Press, Sunset Beach, Calif. (1986), the disclosure of which is incorporated by reference.

A preferred conventional method for placing a patterned resist layer on the surface of the silicon wafer includes first placing resist on the entire surface of the wafer, placing a patterned chromium mask over the wafer so as to shield the resist layer in the areas where the resist is to be maintained; exposing the wafer to UV light so as to decompose the resist thereby permitting removal of the decomposed resist by a developer solution; and as a final step, exposing the silicon wafer to the developer solution thereby retaining only the patterned resist layer on the surface of the wafer.

The resist material employed to form the patterned resist layer is not critical and any resist material conventionally employed with dry non-isotropic etching can be employed to form the patterned resist layer. Typical resist materials so employed include, by way of example, Shipley Resist (Shipley Co., Newton, Mass.) G line resist (available as TSMR 8900 from Ohka America, Inc., Milpitis, Calif.) and the like. The patterned resist layer is formed to be typically from about 0.5 to about 2 microns in thickness.

Etching of the Exposed Polycide Layer

After formation of the polycide layer containing a patterned resist layer on the surface of the silicon wafer (both of which are conventional), the wafer is then etched under dry non-isotropic etching methods to remove the polycide layer from all exposed areas on the silicon wafer (i.e., all areas not covered by resist). The particular dry non-isotropic etching method employed is not critical but preferably is reactive ion etching (RIE).

Reactive ion etching is conventionally conducted in an RIE reaction chamber at a temperature of from about 20° to 60° C., in a suitable etching gas pressure of about 10 to about 500 millitorr. The etching gas employed is not critical and any etching gas conventionally employed to etch polycide under reactive ion etching can be used. Suitable etching gases include, by way of example, $SF_6$, $C_2F_6$, and the like as well as mixtures of $SF_6$ and $C_2F_6$, all of which are typically employed in chlorine gas at a ratio of etching gas to chlorine of from about 1:3 to 3:1 and optionally in the presence of a small amount of oxygen (e.g., a flow of $O_2$ of from about 0 to 2 standard cubic centimeter per minute of $O_2$ into the reaction chamber).

The silicon wafer containing the polycide layer to which a patterned resist layer has been placed is conventionally placed into a wafer holder which is preferably an electrode containing internal cooling/heating means (e.g., a water coils) and means to permit helium backside cooling so as to maintain the electrode and hence the silicon wafer at a constant temperature. The wafer holder is contained or placed into an RIE reaction chamber which contains means to permit helium backside cooling of the wafer holder. RF power, typically from about 100 to about 400 watts, is then passed through the electrode to effect ion generation and hence reactive ion etching.

During etching the helium gas flow onto the backside of the wafer holder is maintained at from 0 to about 3 torr. Surprisingly, it has been found that maintaining the helium gas flow for backside cooling at this level during dry non-isotropic etching of the polycide layer does not detrimentally effect the temperature profile of the wafer but, in fact, significantly reduces the degree of underetching and particulate formation characteristic of similar etching methods using a conventional helium backside pressure of about 10–14 torr.

Reactive ion etching is continued until all of the exposed polycide layer is removed from the surface of the silicon wafer which typically requires from about 1 to about 5 minutes; the exact time of which is dependent on factors such as the thickness of the exposed polycide layer, the temperature of the wafer, the extent of RF power source and the etching gas ratio.

After etching the exposed polycide layer, the wafer is removed from the reaction chamber and the patterned resist layer is then removed by conventional techniques such as exposing the surface of the wafer to $O_2$ plasma, followed by wet treatment with hydrogen peroxide/sulfuric acid. Other methods include use of $O_2$ plasma alone, use of $O_2$ plasma with HF.

In order to further illustrate the present invention and the advantages thereof, the following specific example is given, it being understood that this example is not intended to limit the claimed invention in any manner.

EXAMPLES

A silicon wafer having semi-fabricated circuit elements including gate and field elements is placed into a reaction chamber (Model ILC1015i available from Anelva Corp., San Jose, Calif.) suitable for the sputter deposition of tungsten silicide onto the silicon wafer. Tungsten silicide is used as the target source in the reaction chamber. The reaction chamber is evacuated and argon is injected into the reaction chamber until a pressure of about 10–20 millitorr is reached and the temperature of the chamber is maintained at about 200° C. although a range of from about 150° to 300° C. can be used. An RF field of about 1500 watts is directed onto the target to effect sputtering. Sputtering is continued until the tungsten silicide layer on the silicon wafer is approximately 0.15 microns thick.

TOK resist TSMR 8900 (available from Ohka America, Inc., Milpitis, Calif.) is applied onto the surface of the silicon wafer by spin coating using an SVG 88 spin coater (available from Silicon Valley Group (SVG), San Jose, Calif.) at a spin rate of approximately 5000 rpm until a thickness of about 1.3 microns is reached.

A chrome pattern mask is placed over the wafer and the wafer is exposed to UV light (436 nm) for approximately 0.3 seconds at room temperature at approximately 40±5 percent relative humidity using a Canon Mark II stepper (available from Canon USA, Inc., Santa Clara, Calif.). The wafer is then treated with commercially available developer for G line resist (NMDW developer available from Ohka America, Inc., Milpitis, Calif.) which is applied by spray puddle techniques using an SVG 88 spin coater at approximately 300 rpm until the resist layer exposed to UV light is removed.

The wafer is then placed (clamped) onto a wafer holder which comprises an electrode containing an internal cooling means comprising coils through which water can run. The wafer/wafer holder is then placed into an RIE reaction chamber (Model LRC 4400, available from Lam Research Corporation, Fremont, Calif.) and the chamber is then evacuated. A 3:1 mixture of $SF_6$ or $C_2F_6$ to chlorine is injected into the reaction chamber until the pressure reaches approximately 400 millitorr. The temperature of the reaction chamber is maintained at approximately 40° C. with water running through the coils so as to maintain the temperature at about 40° C.

An RF field of approximately 400 watts is passed through the electrode so as to induce the generation of a plasma within the reaction chamber which plasma contains reactive cations. The plasma further induces a DC bias (negative charge) on the electrode resulting in a flow of reactive cations to the electrode which contact the wafer surface placed in front of the electrode thereby effecting etching. No helium backside cooling is utilized. The RF field is continued until all of the exposed tungsten silicide layer is removed (typically 60–90 seconds).

The wafer is removed from the RIE reaction chamber and the resist layer is removed from the wafer by conventional $O_2$ plasma stripping to provide for a silicon wafer having patterned tungsten silicide over its surface.

Four wafers were processed in a manner similar to that described above in Example 1 with the exception that two of the wafers employed standard helium backside cooling at a pressure of about 14 tort during the dry non-isotropic etching procedure. After the resist layer was removed, the wafers were analyzed for residues. The results of this analysis are as follows:

Wafers Etched in the Presence of He-Backside Cooling

Under microscopic examination, the wafers contained gross residues of tungsten silicide over the surface of the silicon wafer which evidences underetching.

Wafers Etched in the Absence of He-Backside Cooling

Under microscopic examination, the wafers contained no gross residues of tungsten silicide.

By following the procedures set forth above, different polycides can be etched from a silicon wafer including polycides such as molybdenum silicide, titanium silicide, and the like by merely depositing such a silicide onto the wafer in the manner described above and thereafter substituting this wafer in patterning and etching procedures described. As noted previously, such silicides can be formed by either sputtering of the silicide or chemical vapor deposition of the silicide or of the refractory metal followed by thermal annealing of the metal to form the silicide.

Similarly, different conventional resist materials, etching gases, wafer holders, etc. can be used in the methods described above by mere substitution for the recited materials.

Lastly, different dry non-isotropic etching methods can be substituted for the reactive ion etching method described above include such dry non-isotropic etching methods such as reactive ion beam etching, electron beam etching, plasma etching, and the like.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including the equivalents thereof.

What is claimed is:

1. A method for reducing the degree of underetching and particulate formation occurring during dry non-isotropic etching of a polycide layer on the surface of a silicon wafer which comprises:

(a) placing a patterned resist layer over the polycide layer found on the surface of the silicon wafer so as to define areas where the polycide layer is exposed and areas where the polycide layer is covered by the resist layer;

(b) placing the silicon wafer prepared in (a) above into a wafer holder which holder has heating/cooling means in addition to or alternative to helium backside cooling;

(c) removing the exposed polycide layer from the surface of the silicon wafer by dry non-isotropic etching optionally employing backside cooling with a helium gas flow to the backside of the wafer holder wherein the helium gas flow is adjusted to maintain a backside pressure of from 0 to about 3 torr; and (d) removing the resist layer.

2. The method according to claim 1 wherein the polycide layer has a thickness of from about 0.05 to 0.5 microns.

3. The method according to claim 2 wherein the polycide layer is tungsten silicide.

4. The method according to claim 1 wherein the patterned resist layer is from about 0.5 to about 2 microns in thickness.

5. The method according to claim 1 wherein the dry non-isotropic etching method utilizing helium backside cooling is reactive ion etching.

6. The method according to claim 1 wherein the wafer holder is an electrode containing an internal heating/cooling means.

7. The method according to claim 6 wherein the reactive ion etching is conducted at a temperature of from 20° to 60° C. utilizing $SF_6/C_2F_6$ in chlorine.

8. The method according to claim 7 wherein the helium backside pressure is maintained at about 2 torr.

9. The method according to claim 1 wherein no helium backside cooling is employed.

10. A silicon wafer containing patterned layers of polycide on the surface thereof which wafer is prepared by the method which comprises:

(a) placing a patterned resist layer over the polycide layer found on the surface of the silicon wafer so as to define areas where the polycide layer is exposed and areas where the polycide layer is covered by the resist layer;

(b) placing the silicon wafer prepared in (a) above into a wafer holder which holder has heating/cooling means in addition to or alternative to helium backside cooling;

(c) removing the exposed polycide layer from the surface of the silicon wafer by dry non-isotropic etching optionally employing backside cooling with a helium gas flow to the backside of the wafer holder wherein the helium gas flow is adjusted to maintain a backside pressure of from 0 to about 3 torr; and (d) removing the resist layer.

11. The silicon wafer according to claim 10 wherein the polyside layer has a thickness of from about 0.05 to 0.5 microns.

12. The silicon wafer according to claim 11 wherein the polycide layer is tungsten silicide.

13. The silicon wafer according to claim 12 wherein the patterned resist layer is from about 0.5 to about 2 microns in thickness.

14. The silicon wafer according to claim 10 wherein the dry non-isotropic etching method utilizing helium backside cooling is reactive ion etching.

15. The silicon wafer according to claim 14 wherein the wafer holder is an electrode containing an internal heating/cooling means.

16. The silicon wafer according to claim 15 wherein the reactive ion etching is conducted at a temperature of from 20° to 60° C. utilizing $SF_6/C_2F_6$ in chlorine.

17. The silicon wafer according to claim 16 wherein the helium backside pressure is maintained at about 2 torr.

18. The silicon wafer according to claim 10 wherein no helium backside cooling is employed.

* * * * *